(12) United States Patent
Selmeier et al.

(10) Patent No.: US 6,351,197 B1
(45) Date of Patent: Feb. 26, 2002

(54) SURFACE ACOUSTIC WAVE FILTER HAVING AN IMPROVED EDGE STEEPNESS VIA SERIES RESONATORS WITH DIFFERENT FINGER PERIODICITIES

(75) Inventors: Peter Selmeier, Maitenbeth; Maximilian Pitschi, Rottach-Egern, both of (DE)

(73) Assignee: EPCOS AG, Munich (DE)

( * ) Notice: Subject to any disclaimer, the term of this patent is extended or adjusted under 35 U.S.C. 154(b) by 0 days.

(21) Appl. No.: 09/484,798

(22) Filed: Jan. 18, 2000

Related U.S. Application Data

(63) Continuation of application No. PCT/DE98/01972, filed on Jul. 14, 1998.

(30) Foreign Application Priority Data

Jul. 17, 1997 (DE) .......................... 197 30 710

(51) Int. Cl.[7] ................................................ H03H 9/64
(52) U.S. Cl. ...................................... 333/195; 333/193
(58) Field of Search ................................ 333/193–196; 310/313 R, 313 B, 313 C, 313 D

(56) References Cited

U.S. PATENT DOCUMENTS

| | | | | |
|---|---|---|---|---|
| 5,471,178 A | * | 11/1995 | Hickernell | 333/193 |
| 5,543,757 A | * | 8/1996 | Kobayashi et al. | 333/193 X |
| 5,638,036 A | * | 6/1997 | Penunurl et al. | 333/194 |
| 5,933,062 A | * | 8/1999 | Kommrusch | 333/193 |
| 5,963,113 A | * | 10/1999 | Ou et al. | 333/193 |
| 6,025,762 A | * | 2/2000 | Roy et al. | 333/150 |
| 6,031,435 A | * | 2/2000 | Inose et al. | 333/193 |
| 6,201,457 B1 | * | 3/2001 | Hickernell | 333/193 |
| 6,208,224 B1 | * | 3/2001 | Taniguchi et al. | 333/193 |

FOREIGN PATENT DOCUMENTS

| | | |
|---|---|---|
| DE | 44 08 989 C2 | 12/1994 |
| DE | 196 38 627 A1 | 4/1998 |
| EP | 0 614 272 A1 | 9/1994 |
| JP | 9-93072 | * 4/1997 |
| JP | 10-242799 | * 9/1998 |

* cited by examiner

*Primary Examiner*—Robert Pascal
*Assistant Examiner*—Barbara Summons
(74) *Attorney, Agent, or Firm*—Herbert L. Lerner; Laurence A. Greenberg; Werner H. Stemer

(57) ABSTRACT

A surface acoustic wave (SAW) filter having an improved edge steepness includes at least three resonators connected in series and/or parallel with one another. An edge steepness of a pass band is improved if a plurality of resonators with different finger periodicities of interdigital transducers are provided.

9 Claims, 4 Drawing Sheets

SURFACE ACOUSTIC WAVE FILTER HAVING AN IMPROVED EDGE STEEPNESS VIA SERIES RESONATORS WITH DIFFERENT FINGER PERIODICITIES

CROSS-REFERENCE TO RELATED APPLICATION

This application is a continuation of copending International Application No. PCT/DE98/01972, filed Jul. 14, 1998, which designated the United States.

BACKGROUND OF THE INVENTION

Field of the Invention

The invention relates to a surface acoustic wave (SAW) filter of the resonator type, which is suitable as a bandpass filter with low losses and a high cut-off band attenuation ratio, in particular as an input or output filter for cordless or mobile telephones.

Such an SAW filter is known, for example, from German Patent DE 44 08 989 C2. That filter has a large number of surface acoustic wave resonators, which are connected in series and parallel with one another. Each of the resonators includes an interdigital transducer, which is disposed between two reflectors. Both electrode fingers of the interdigital transducers and reflectors (which are disposed, for example, like a grid) have a finger periodicity which corresponds essentially to half a wavelength of a resonant frequency.

Consequently, not only the surface acoustic waves produced at the individual electrode fingers, but also the surface acoustic waves reflected at the individual reflectors can be optimally amplified by constructive interference. An RF signal can thus be transmitted virtually without any losses from one connection of the surface acoustic wave resonator to the other. The series and parallel connection of a plurality of resonators also results in frequencies outside the pass band being further attenuated, and a cut-off band suppression thus being increased. Outside the pass band, SAW filters of the resonator type provide optimum cut-off band suppression, if the finger periodicity of the reflectors and of the interdigital transducers is in each case the same for all of the interconnected series resonators and for all of the interconnected parallel resonators. The above-mentioned German patent also proposes that the finger periodicity, or the distance between the electrodes in the reflectors, be set in such a way that it is not the same as the distance between the electrodes in the interdigital transducers. That proposal relates, in particular, to the distance between the electrodes in the reflectors of those resonators which are connected in series with one another. That results in the elimination of the interference spike, which occurs outside the pass band in known filters.

However, in those and other known SAW filters of the resonator type, it is regarded as a disadvantage that the edges of the pass band on the pass band curve do not fall sufficiently steeply, and that the transition between the pass band and the cut-off band is not sharp enough, so that the pass band curve falls too slowly in that region, or has excessively rounded edges.

SUMMARY OF THE INVENTION

It is accordingly an object of the invention to provide a surface acoustic wave (SAW) filter of the resonator type having an improved edge steepness, which overcomes the hereinafore-mentioned disadvantages of the heretofore-known devices of this general type, which has good cut-off band suppression and which nevertheless has a sufficiently broad pass band with steeply falling edges.

With the foregoing and other objects in view there is provided, in accordance with the invention, a surface acoustic wave (SAW) filter with two ports, comprising a substrate having mutually parallel tracks for surface acoustic waves; at least three resonators in the tracks, each of the resonators having reflectors, an interdigital transducer disposed between two of the reflectors, a pair of electrical connections, and a plurality of electrode fingers disposed at a finger periodicity; the resonators including resonators connected in series through the connections and resonators connected in parallel with the resonators connected in series; and the resonators including a plurality of resonators of at least one resonator type, at least two of the plurality of resonators differing with respect to the finger periodicities of the interdigital transducers.

The SAW filter according to the invention has at least two resonators, which are connected in parallel and/or in series with one another, and in which either the series-connected resonators and/or the parallel-connected resonators have at least two different finger periodicities of the interdigital transducers. The magnitude of this discrepancy in the finger periodicities allows a greater pass band edge steepness to be achieved deliberately and, in particular, a sharper transition to be achieved from the pass band to the cut-off band. Furthermore, a flatter pass band is provided, with the forward loss being low and unchanged. This result is surprising and contradicts the values which one has been led to expect for such a configuration. A shallower edge steepness is actually expected for resonators with a different finger periodicity than for filters with resonators connected in parallel and series and which have the same finger periodicity. However, the invention provides an SAW filter with an edge steepness that at least remains the same.

It is furthermore possible to deliberately make one of the two edges of the pass band steeper with an SAW filter according to the invention. This may be that edge which bounds the pass band toward higher frequencies, or else that edge which bounds the pass band toward lower frequencies. On one hand, this is achieved if different finger periodicities are set only for series-connected resonators, with the left-hand edge, which points toward lower frequencies, being set to be steeper. On the other hand, by differently setting the finger periodicities in the parallel-connected resonators, the right-hand edge of the pass band, which is the edge that points toward higher frequencies, is made steeper. Furthermore, the transition from the pass band to the edge (for example in the relative attenuation range from 0 to 3 dB) is more abrupt.

In accordance with another feature of the invention, at least three different finger periodicities are selected for series-connected resonators $R_{s1}$ to $R_{sn}$ (where $n \geq 3$), in which case the resonator having the greatest finger periodicity is disposed on the outside in the series circuit, while the resonator having the smallest finger periodicity is disposed in the center. If there are more than three series-disposed resonators, the resonator having the smallest finger periodicity is preferably not disposed adjacent the resonator having the greatest finger periodicity.

In accordance with a further feature of the invention, there are provided four series-connected resonators, in which case each series resonator forms a basic member with a resonator connected in parallel with it, the parallel-connected resonators in the basic member can be assigned either to only one or to two adjacent basic members, three different values are set for the finger periodicity of the electrode fingers of the series resonators, an outer resonator in turn has the greatest finger period, the resonator having the smallest finger period is located on the inside, and the other outer resonator and one inner resonator have the same finger periods. Finger periods P1 to P4 for four series-disposed resonators R1 to R4 are thus: P2<P1=P3<P4 or P3<P1=P2<P4, or in the opposite order in each case.

In general, it can be said that better cut-off band suppression is achieved with a greater number of series-connected resonators. In the case of SAW filters according to the invention, and with a given number of parallel-connected resonators, the maximum number of series-connected resonators are selected, in order to obtain a maximum variation capability for the configuration of the finger periodicities, with the minimum total number of resonators. For example, an SAW filter according to the invention having three basic members can be formed by two parallel resonators and three series resonators, and an SAW filter according to the invention having four basic members can be formed with four series resonators and two parallel resonators.

Analogously, a filter according to the invention may include three basic members with a maximum number of parallel resonators and a minimum number of series resonators. In that case the finger periods of the interdigital transducers in the parallel resonators have at least two different values, but three different values for three or more basic members.

Furthermore, additional series-connected resonators may be provided, which have no adjacent parallel-connected resonator, and/or can form one basic member with no resonator connected in parallel with it.

In accordance with an added feature of the invention, at least one series resonator is replaced by two parallel-connected resonators, having respective inputs and outputs which are connected to one another.

In accordance with a concomitant feature of the invention, with regard to the differences to be set for the finger periodicities, discrepancies of 0.1 to 3 percent have been found to be suitable, and 0.5 to 1 percent have been found to be particularly advantageous. While the characteristics and, in particular, the pass band of the filter become poorer again as the discrepancies in the finger periodicity become greater, the effect according to the invention, namely the steeper setting of the edge pass band, is reduced as the discrepancies in the finger periodicity become smaller.

The specific setting of a higher edge steepness for only one edge is advantageous if two adjacent frequency bands have to be separated from one another. For example, the mobile radio network for the GSM Standard uses different frequency bands for transmitters and receivers. Those are separated from one another by, for example, 20 MHz. If SAW filters according to the invention are now used as input and output filters, then it is possible, specifically, to construct those edges of the pass bands to be steeper which bound the pass band to the adjacent pass band for the transmitter or receiver band. Since the transmitter band in the GSM Standard is lower than the receiver band, filters with a steep right-hand edge (toward higher frequencies) are advantageously used for the transmission band, and filters with a steep left-hand edge (toward lower frequencies) of the pass band are used for the receiver band.

Other features which are considered as characteristic for the invention are set forth in the appended claims.

Although the invention is illustrated and described herein as embodied in a surface acoustic wave filter having an improved edge steepness, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1A:
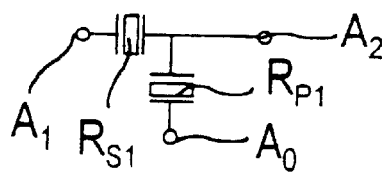
FIGS. 1A to 1L are schematic circuit diagrams showing how resonators are connected to one another.

Referring now to the figures of the drawings in detail and first, particularly, to FIGS. 1A to 1L thereof, there is seen a number of examples to show how series resonators $R_s$ and parallel resonators $R_p$ can be connected to one another in a filter. FIG. 1A shows a basic member of a filter, in which a resonator $R_{S1}$ is connected between two connections A1 and A2, and a resonator $R_{P1}$ is connected in parallel with it and is at any desired constant potential, for example at ground potential. In this case, each basic member includes such a pair of resonators $R_S$ and $R_p$. Each possible pair in this case forms a basic member, and it is possible for both series and parallel resonators to belong to two adjacent basic members.

Figure 1B:
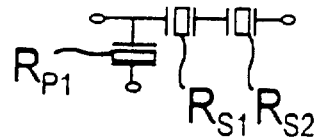
Figure 1C:
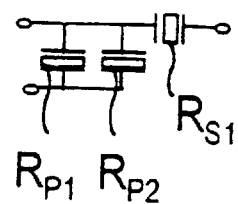
Figure 1D:
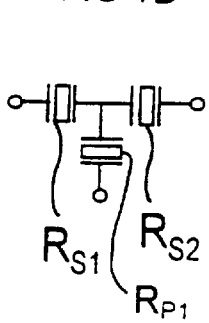
Figure 1E:
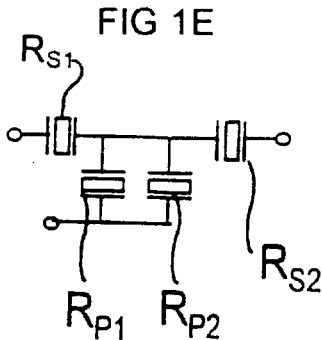

FIGS. B1 and 1C show the simplest embodiments according to the invention, each having one basic member ($R_{S1}$, $R_{P1}$). In addition, the filters in this case also include an additional parallel or series resonator, which is not associated with any basic member. In FIG. 1B, two resonators $R_{S1}$ and $R_{S2}$ are connected in series with one another and the resonator $R_{p1}$ is connected in parallel with them. In FIG. 1C, two resonators $R_{P1}$ and $R_{P2}$ are connected in parallel with one resonator $R_{S1}$.

Figure 1F:
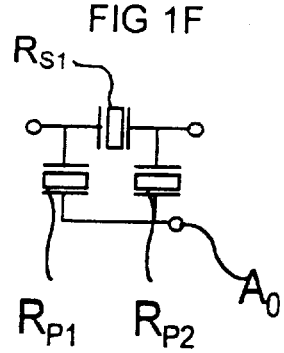
Figure 1G:
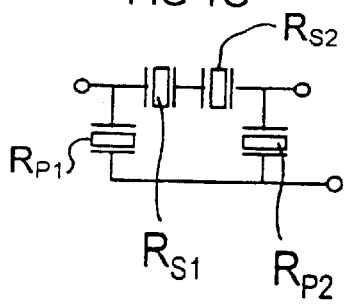

FIGS. 1D to 1G show filters including two basic members. The filters shown in FIGS. 1D, 1E and 1G include two series resonators $R_{S1}$ and $R_{S2}$, with one resonator $R_{P1}$ (FIG. 1D) or two resonators $R_{P1}$ and $R_{P2}$, (FIGS. 1E and 1G) being connected in parallel with them. FIG. 1F shows a series resonator $R_{S1}$ connected to two parallel resonators $R_{P1}$ and $R_{P2}$.

Figure 1H:
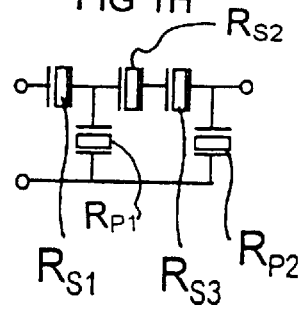
Figure 1I:
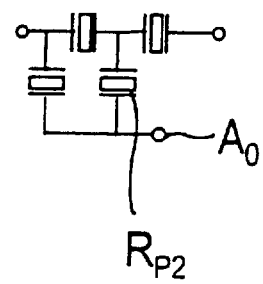
Figure 1J:
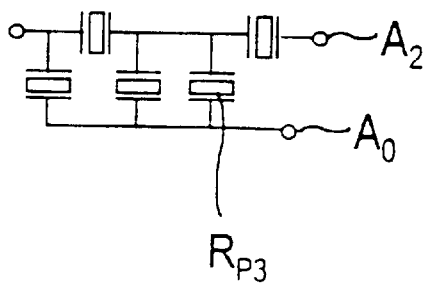

FIGS. 1H, 1I and 1J show filters with three basic members. FIG. 1H includes three series resonators RS1 to RS3, and two resonators RP1 and RP2 connected in parallel with them. The filter shown in FIG. 1I includes two series resonators and two parallel resonators. The filter shown in FIG. 1J includes two series resonators and three parallel resonators.

Figure 1K:
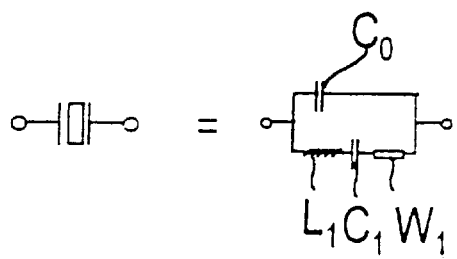
Figure 1L:
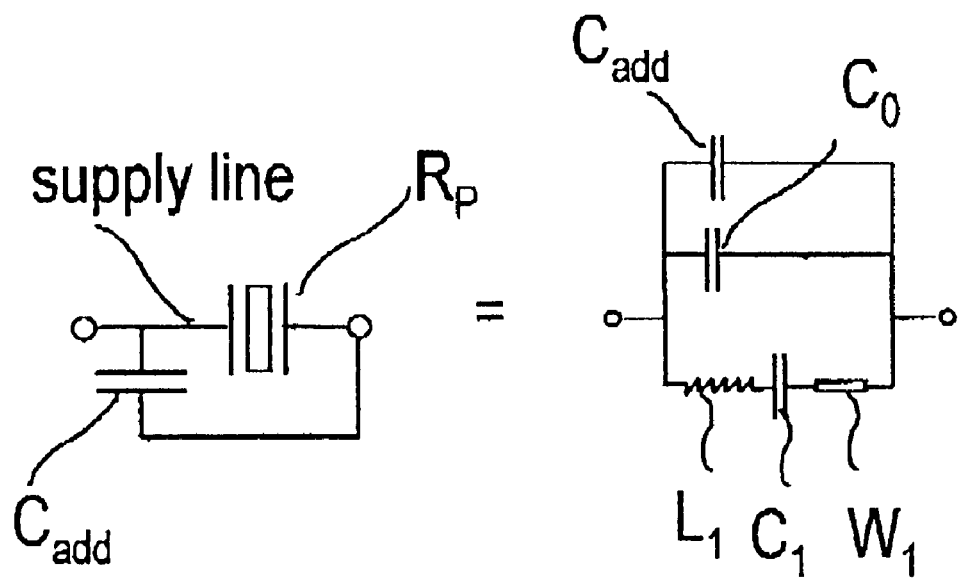

In addition to the illustrated filters, filters according to the invention may likewise include further parallel or series resonators which in each case are produced by splitting an individual resonator into two series-connected or parallel-connected resonators, in a similar way to the examples shown in FIGS. 1B and 1C. In the series path of the circuit, a resonator $R_S$ can be replaced by two resonators connected in parallel with one another and, in a similar way to the parallel path, a resonator $R_P$ can be replaced by two series-connected resonators. FIG. 1K shows an equivalent circuit of an individual resonator, which includes a steady-state capacitance $C_0$ and an inductance $L_1$, a capacitance $C_1$ and a pure resistance $W_1$ connected in parallel with the capacitance $C_0$.

Figure 2:
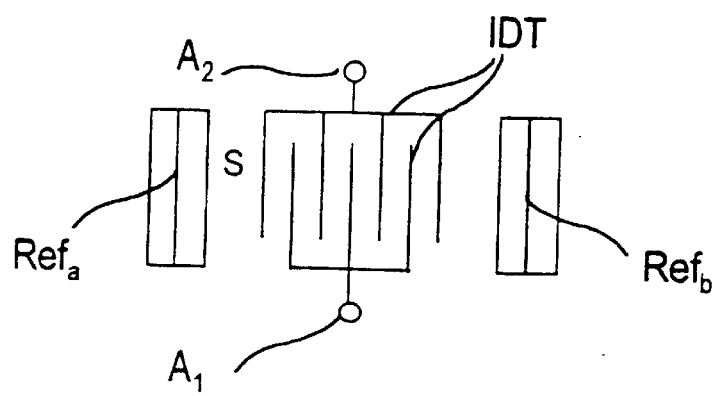
FIG. 2 is a diagrammatic, plan view showing a structure of a filter having interdigital transducers and reflector electrodes disposed on a substrate.

FIG. 2 uses a diagrammatic illustration to show how an individual resonator is formed on a piezoelectric substrate S. Each resonator in this case includes an interdigital transducer IDT as well as two reflectors $Ref_a$ and $Ref_b$ disposed at the sides of the transducer and located in a main propagation direction of a surface acoustic wave. Any desired piezoelectric material, preferably monocrystalline material, may be used as the substrate, and is selected as a function of the desired pass band of the filter. For example, the already mentioned GSM Standard has a system bandwidth of 25 MHz. The pass band of a filter which is suitable for this purpose must therefore at least comply with the system bandwidth. Such a pass band can be obtained, for example, on specific crystal sections of the piezoelectric substrates lithium tantalate $LiTaO_3$ lithium niobate $LiNbO_3$. The reflectors $Ref_a$ and $Ref_b$ and the interdigital transducers IDT are formed as metallic conductor structures and are composed, for example, of aluminum.

In the simplest case, distances between electrode fingers in the interdigital transducers IDT and a grid spacing in the reflectors $Ref_a$ and $Ref_b$ are identical. A term "finger period P" in this case means a distance between centers of two adjacent fingers in an interdigital transducer IDT. An interdigital transducer IDT has a plurality of fingers, with an exact number and an overlap that is dependent on the desired impedance which is thus achieved. Typically, an interdigital transducer IDT has 20 to 300 fingers. Likewise typically, the electrode fingers have a width b, which corresponds exactly to a distance d to adjacent electrode fingers of another interdigital transducer. Since the finger periodicity corresponds to half the wavelength of the surface acoustic wave being produced, $d=b=\lambda/4$ in such a case. In order to provide for better reproducibility, a quotient b/P (which is also referred to as a metallization ratio η) may assume a value between 0.6 and 0.8, with d then being correspondingly smaller (also see German Published, Non-Prosecuted Patent Application DE-41 15 080 A1, for example, in this context).

A plurality of such tracks with resonators are fitted geometrically parallel to one another on a common substrate for a filter. The electrical circuitry of the individual resonators on a common substrate S may be as shown in FIG. 1. However, it is also possible to form filters including even more basic members, which then require a correspondingly greater number of tracks on the substrate S.

Figure 3:
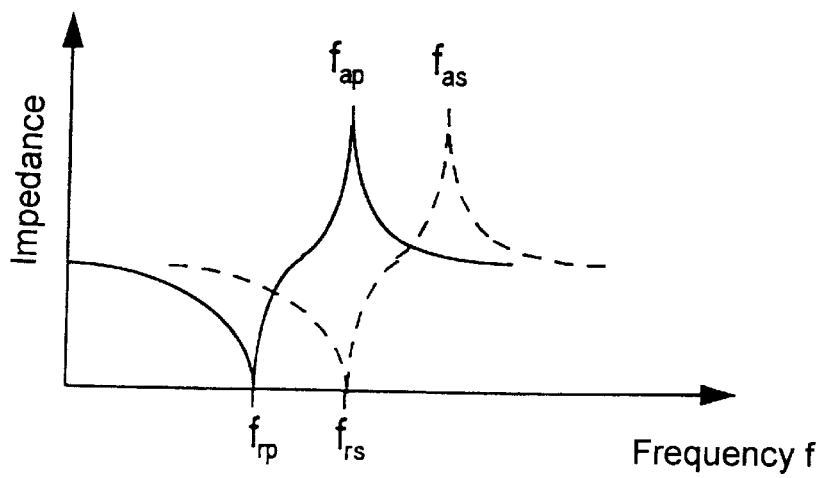
FIG. 3 is a graph of an impedance profile, plotted against frequency, of parallel-connected and series-connected resonators.

FIG. 3 shows an impedance profile of two resonators plotted against frequency. A filter having a pass band is obtained in this case if at least one basic member is provided, including a series resonator and a parallel resonator. An individual resonator in each case has one resonant frequency $f_r$ with minimum impedance, and one antiresonant frequency $f_a$ with maximum impedance. In a basic member of a filter, resonant and antiresonant frequencies of the respective series and parallel resonators are essentially matched to one another in such a way that the resonant frequency $f_{rs}$ of the series resonator $R_S$ corresponds to the antiresonance $f_{ap}$ of the resonator $R_P$ connected in parallel with it. This results in a filter which has a pass band around $f_{rs}$ and $f_{ap}$.

Figure 4:
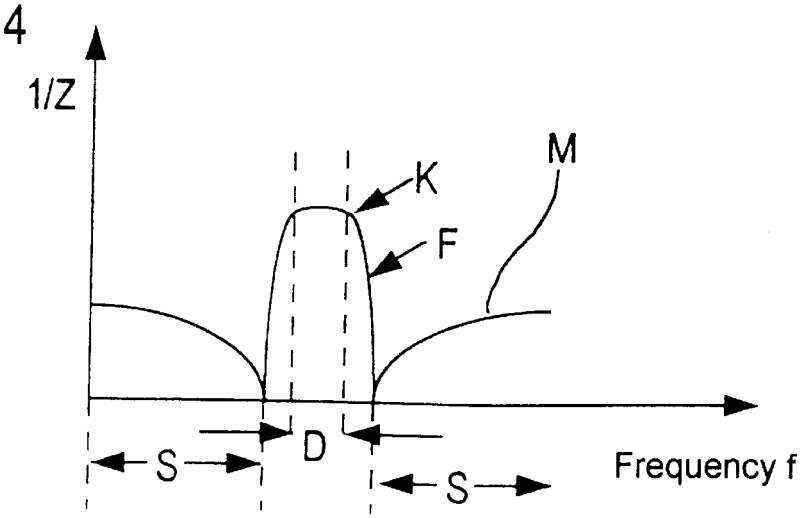
FIG. 4 is a graph showing a frequency response of a filter.

FIG. 4 shows a frequency response of a filter in which an amplitude ratio of a filter output relative to a signal applied to a filter input is plotted against the frequency f.

A maximum signal is obtained in a pass band D. On both sides of the pass band, a curve M of the frequency response has a minimum, and then rises once again to a value which corresponds to a cut-off band suppression. In order to provide a good filter response, the aim is now to achieve a steep transition F from the pass band D to the cut-off band S.

The aim is thus to produce particularly steep edges F for a good filter response. The transition from the pass band to an edge, the edge K, should also be configured to be as square as possible. The aim is thus to achieve a minimum radius of curvature for the curve in the region of the edge K.

Figure 5:
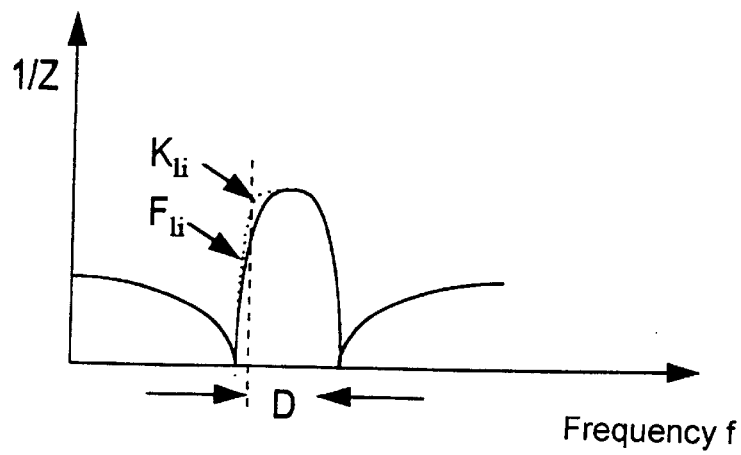
FIG. 5 is a graph showing a frequency response of a filter having an improved left-hand edge.

FIG. 5 shows a transfer function for a first filter according to the invention, in which the resonant frequency $f_r$ of the series resonators $R_S$ and the finger periodicities of the interdigital transducers IDT of the series resonators are not the same. The measurement curve is obtained, by way of example, for a filter having three basic members, which are connected as shown in FIG. 1H. The solid curve shows the filter response of a conventional filter, in which the finger periodicities P of the series resonators match. The dashed curve corresponds to a filter according to the invention, with different finger periodicities P for the interdigital transducers IDT in the series resonators $R_S$. At the same time, the interdigital transducers IDT in the parallel resonators $R_P$ have identical resonant frequencies and finger periodicities.

FIG. 5 clearly shows that the transfer function M of the filter according to the invention has a steeper left-hand edge $F_{li}$ and an improved edge $K_{li}$ in the transition from the edge to the pass band. A right-hand edge $F_{re}$ remains approximately unchanged. In the case of the finger periodicities P of the interdigital transducers IDT of the series resonators, it can be said that $P_3>P_1$, $P_2$ and $P_1<P_2$, $P_3$ and, for the resonant frequencies resulting from this, $f_{r3}<f_{r1}$, $f_{r2}$ and $f_{r1}>f_{r2}$, $f_{r3}$, respectively.

Figure 6:
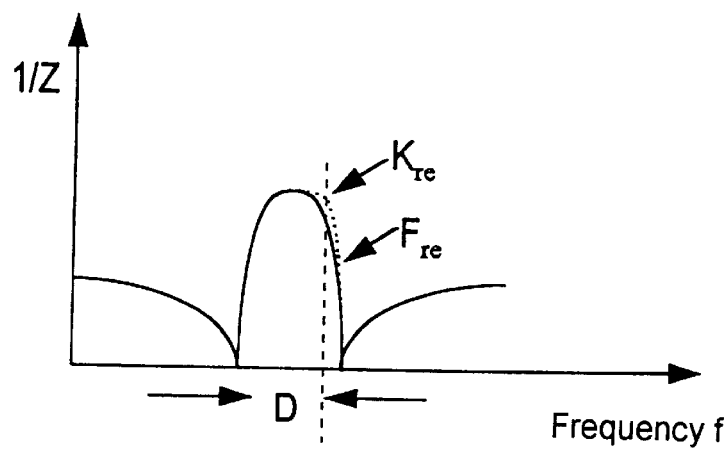
FIG. 6 is a graph showing a frequency response of a filter having an improved right-hand edge.

FIG. 6 shows the pass band of a filter according to the invention, in which the finger periodicities of the interdigital transducers of the parallel-connected resonators $R_P$ differ and which is connected or constructed, by way of example, as shown in FIG. 1J. Once again, an improvement in the edge of the pass band is achieved but, in this embodiment, this is evident on the right-hand edge, pointing toward higher frequencies. The right-hand edge $F_{re}$ is considerably steeper, and a corresponding edge $K_{re}$ is more sharply pronounced.

Figure 7:
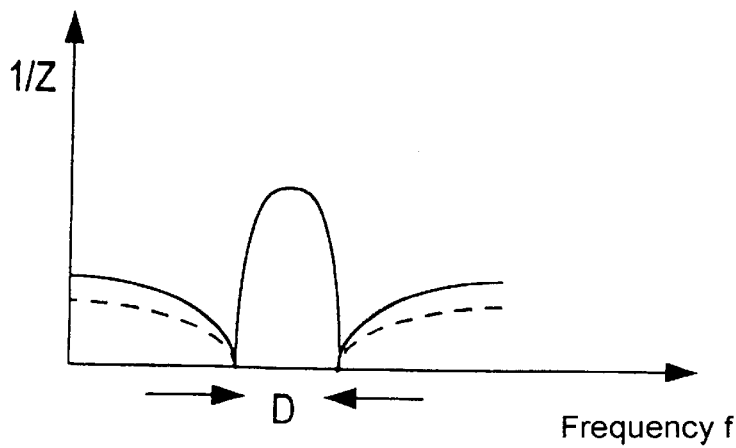
FIG. 7 is a graph showing a frequency response of a filter having improved selection.

FIG. 7 shows a further advantageous improvement of the filter according to the invention, which leads to increased interference band suppression. In this refinement, a metallized surface which is electrically insulated from a parallel resonator $R_P$ is disposed in the immediate physical vicinity of that parallel resonator $R_P$, and is connected to a connection $A_0$. This metallized surface $C_{add}$ makes it possible to influence the steady-state capacitance $C_{OP}$ of a resonator $R_P$ (see reference symbol $C_0$ in FIG. 1L) deliberately, in such a way that a ratio $C_{OP}/C_{OS}$ to the steady-state capacitance $C_{OS}$ of the series resonator $R_S$ is increased. It was admittedly already known for this ratio to be increased by directly varying the steady-state capacitances, for example by varying the aperture or the number of fingers in the interdigital transducers, in order to achieve increased interference band suppression. However, an unavoidable consequence thereof was that the pass band D, the edge steepness and the forward loss also became poorer, so that the filter was no better overall. However, with the additional metallized surface according to the invention in the vicinity of a parallel resonator, this ratio of the steady-state capacitances is positively influenced, without the poor side-effects occurring. This leads to increased interference band suppression (see the dashed line in FIG. 7), while the pass band remains unchanged in comparison to a filter without any additional metallized surface (see the solid line in FIG. 7).

Independently of the refinements according to the invention, filters according to the invention may have further refinements, which are already known per se from conventional filters. Thus, for example, the series resonators $R_S$ may have resonant frequencies $f_{rs}$ which are coincident with the antiresonant frequency $f_{ap}$ of the parallel resonator $R_P$, or are slightly above it. A further variation relates to the finger periodicity of the reflectors in the parallel and/or series resonators. Independently of the invention, the latter may have the same period as or a different period from the fingers of the associated interdigital transducer. In addition, the reflectors of all of the series or all of the parallel resonators may each jointly have the same period or, in another embodiment, different periods as well. In the same way, the distance between the interdigital transducers IDT and the reflectors Ref may be an odd-numbered multiple of $\lambda/4$, or else may differ slightly from this value.

We claim:

1. A surface acoustic wave filter, comprising:

a substrate having mutually parallel tracks for surface acoustic waves;

at least three resonators in said tracks, each of said resonators having reflectors, an interdigital transducer disposed between two of said reflectors, a pair of electrical connections, and a plurality of electrode fingers disposed at a finger periodicity;

said resonators including a first type of resonator connected in series through said connections and a second type of resonator connected in parallel with said first type of resonator; and said resonators including n series-connected resonators $R_s 1, \ldots R_s x, \ldots R_s n$ having a different finger periodicity $p_s 1, \ldots p_s x, \ldots p_s n$ of said electrode fingers in said interdigital transducers, wherein n and x are integers, $n \geq 3$ and $1 < x < n$, and a resonator with a smallest finger periodicity disposed on an inside, so that for at least one value of x: $p_s x < p_s 1 < p_s n$.

2. The SAW filter according to claim 1, wherein: said resonators include a resonator having a greatest finger periodicity disposed on an outside.

3. The SAW filter according to claim 1, including: four basic members, one of said basic members having a series-connected resonator and a parallel-connected resonator, one of said resonators belonging to up to two of said basic members; and $p_s 2 < p_s 1 = p_s 3 < p_s 4$ or $p_s 3 < p_s 1 = p_s 2 < p_s 4$, for said finger periodicity of said electrode fingers of said series resonators.

4. The SAW filter according to claim 1, wherein said finger periodicity of said interdigital transducers has a discrepancy of 0.1–3% from a standard finger periodicity corresponding to a mid-frequency of a pass band of the SAW filter.

5. The SAW filter according to claim 1, wherein said resonators include r series resonators having a standard finger periodicity, and s series resonators having a finger periodicity differing from said standard finger periodicity, wherein: $s/r \leq 2$.

6. The SAW filter according to claim 1, including basic members each having a series-connected resonator and an associated parallel-connected resonator, said series-connected resonator of at least one of said basic members having a resonant frequency equal to an antiresonant frequency of said associated parallel resonator.

7. The SAW filter according to claim 1, including basic members each having a series-connected resonator and an associated parallel-connected resonator, said series-connected resonator of at least one of said basic members having a resonant frequency greater than an antiresonant frequency of said associated parallel resonator.

8. The SAW filter according to claim 1, including a SAW filter surface and a metallization on said surface, said resonators having steady-state capacitances, said steady-state capacitance of at least one parallel resonator being influenced deliberately by a physically close configuration of said metallization on said surface, and said metallization forming a capacitance with parts or supply lines of said parallel resonator to produce a desired ratio to said steady-state capacitance of said series resonator.

9. The SAW filter according to claim 1, including a SAW filter surface and a metallization on said surface, said metallization having a ratio $\eta$ formed from a quotient b/P of a width b of said fingers of said interdigital transducers and a period P of said fingers of said interdigital transducers, wherein $\eta = 0.6$ to $0.8$.

* * * * *